United States Patent
Solanki et al.

(10) Patent No.: US 10,440,870 B1
(45) Date of Patent: Oct. 8, 2019

(54) LOCKING GRIPPER HEAD

(71) Applicant: TE CONNECTIVITY CORPORATION, Berwyn, PA (US)

(72) Inventors: Swapnilsinh Solanki, Harrisburg, PA (US); Edward T. Price, III, Mechanicsburg, PA (US); Xinping Deng, Middletown, PA (US)

(73) Assignee: TE Connectivity Corporation, Berwyn, PA (US)

( * ) Notice: Subject to any disclaimer, the term of this patent is extended or adjusted under 35 U.S.C. 154(b) by 0 days.

(21) Appl. No.: 16/189,035

(22) Filed: Nov. 13, 2018

(51) Int. Cl.
*B25J 15/08* (2006.01)
*H05K 13/04* (2006.01)
*B25J 15/02* (2006.01)
*B25J 15/00* (2006.01)

(52) U.S. Cl.
CPC ...... *H05K 13/0413* (2013.01); *B25J 15/0042* (2013.01); *B25J 15/0052* (2013.01); *B25J 15/0253* (2013.01); *H05K 13/0408* (2013.01)

(58) Field of Classification Search
CPC .......................... H05K 13/0413; B25J 15/0042
USPC .............................................. 294/207, 119.1
See application file for complete search history.

(56) References Cited

U.S. PATENT DOCUMENTS

| | | | | |
|---|---|---|---|---|
| 4,653,794 A | * | 3/1987 | Atlas ................. | H05K 13/0408 294/207 |
| 5,403,057 A | * | 4/1995 | Sugito ................. | B25B 1/2421 269/266 |
| 8,172,292 B1 | * | 5/2012 | Andersen ............ | B25J 11/0045 294/2 |
| 8,602,473 B2 | * | 12/2013 | Weber ................. | B25J 15/0266 294/119.1 |
| 8,997,322 B1 | * | 4/2015 | Barquist ............... | B23P 19/02 29/244 |
| 9,737,994 B2 | * | 8/2017 | Ishikawa .............. | B25J 15/0047 |
| 2013/0140839 A1 | * | 6/2013 | Quinn ...................... | B66C 1/44 294/207 |

* cited by examiner

*Primary Examiner* — Paul T Chin

(57) ABSTRACT

A gripper head and method for use to pick up and securely hold an electrical component. Gripper arms move between a gripper jaw first position in which the gripper arms are spaced from the electrical component and a gripper jaw second position in which the gripper arms engage the electrical component to prevent the electrical component from moving in a direction transverse to a longitudinal axis of the gripper head. A securing plate moves between a securing plate first position in which the securing plate is spaced from the electrical component and a securing plate second position in which the securing plate and the securing projection engage the electrical component to prevent the electrical component from moving in a direction in line with the longitudinal axis of the gripper head and rotationally about the longitudinal axis.

20 Claims, 7 Drawing Sheets

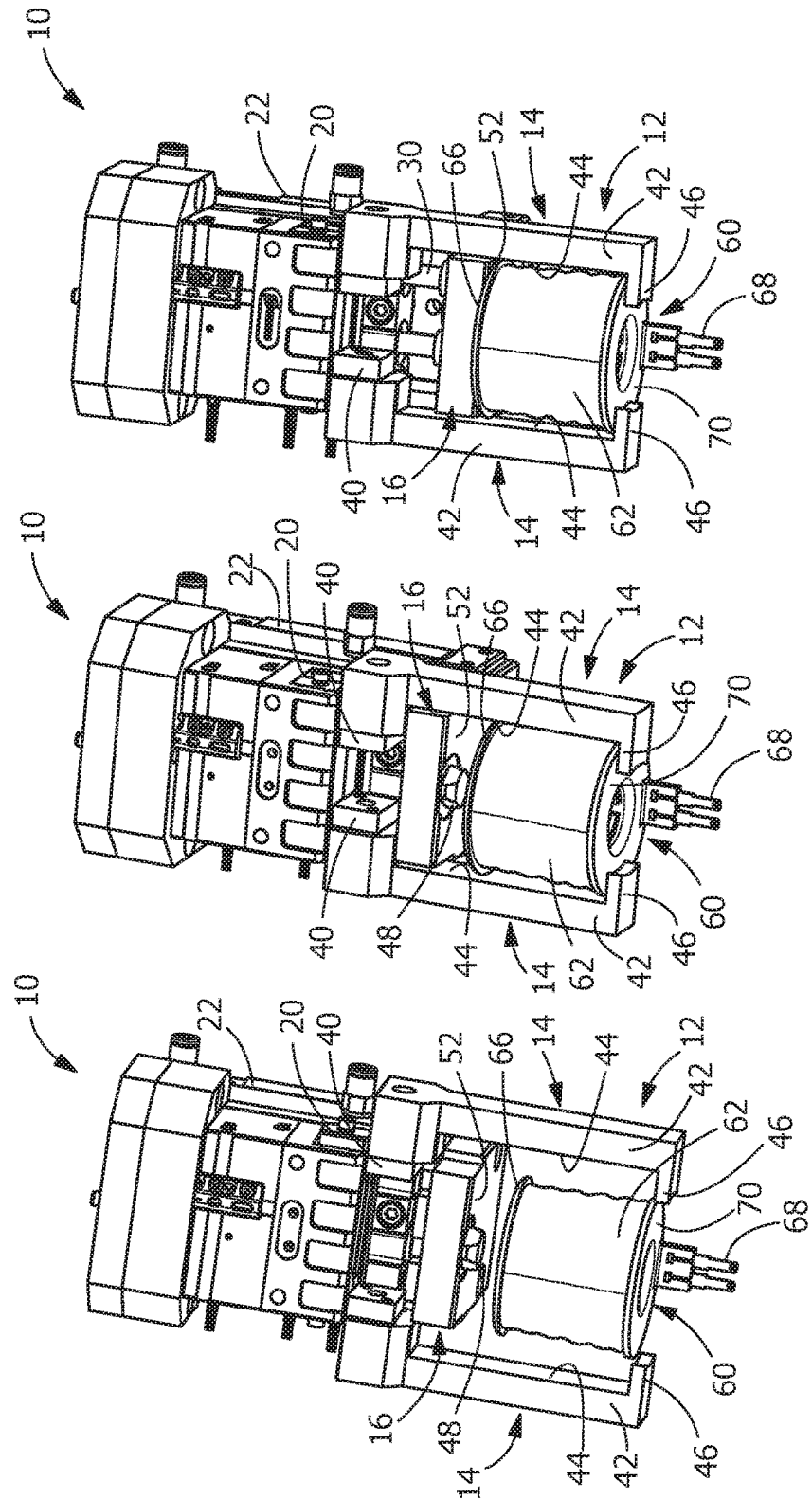

LOCKING GRIPPER HEAD

FIELD OF THE INVENTION

The invention is directed to a gripper mechanism for holding objects in position. In particular, the invention is directed to a gripper head which locks the object in place relative to the gripper mechanism to prevent the movement of the object relative to the gripper mechanism.

BACKGROUND OF THE INVENTION

Gripper heads for lifting an object, for example a connector, and positioning the object in a different location, for example on a printed circuit board, are known in the industry. Many such gripper heads have mechanical or pneumatic units to control gripper jaws or arms. The gripper jaws or arms are moved into engagement with outside surfaces of the object. Force is applied to the gripper jaws or arms to secure the object between the gripper jaws or arms, allowing the gripper head to pick up and transport the object to another location. Once properly moved to the location, the gripper head moves or inserts the object as required. Once properly moved or inserted, the gripper jaws or arms are retracted from the object, allowing the object to remain in the moved or inserted position.

While known gripper heads are well suited to lift and place many objects, the known gripper heads do not provide sufficient accuracy when in which precision location is required for insertion. For example, if an electrical component with contacts extending therefrom is to be inserted into a mating component which has little clearance, the contacts may be easily bent during insertion, as known gripper heads cannot precisely control the positioning of the electrical component within the gripper head. Alternately, the electrical component may not be able to be inserted into the mating component.

It would, therefore, be beneficial to provide gripper head or mechanism which can pick up objects such as electrical components and lock the components in position relative to the gripper head or mechanism, preventing the object or electrical component from moving in a direction transverse to a longitudinal axis of the gripper head, preventing the electrical component from moving in a direction in line with the longitudinal axis of the gripper head and preventing the electrical component from moving rotationally about the longitudinal axis of the gripper head.

SUMMARY OF THE INVENTION

An embodiment is directed to a gripper head for use to pick up and securely hold an electrical component. The gripper includes a base with a first actuator and a second actuator. Gripper jaws extend from the base. The gripper jaws are connected to the first actuator wherein the actuation of the first actuator causes gripper arms of the gripper jaws to move between a gripper jaw first position in which the gripper arms are spaced from the electrical component and a gripper jaw second position in which the gripper arms engage the electrical component to prevent the electrical component from moving in a direction transverse to a longitudinal axis of the gripper head. A securing plate extends from the base. The securing plate has a securing projection extending from a surface of the securing plate. The securing plate is connected to the second actuator wherein the actuation of the second actuator causes the securing plate to move between a securing plate first position in which the securing plate is spaced from the electrical component and a securing plate second position in which the securing plate and the securing projection engage the electrical component to prevent the electrical component from moving in a direction in line with the longitudinal axis of the gripper head and prevent the electrical component from moving rotationally about the longitudinal axis. The electrical component is held in a fixed position relative to the gripper head when the gripper arms are in the gripper jaw second position and the securing plate and the securing projection are in the securing plate second position.

An embodiment is directed to a gripper head for use to pick up and securely hold an electrical component. The electrical component has a first surface, and oppositely facing second surface and side surfaces which extend between the first surface and the second surface. The gripper head includes a base having a first actuator and a second actuator. Gripper jaws extend from the base. The gripper jaws have gripper arms which are spaced from the base. The gripper jaws are connected to the first actuator wherein the actuation of the first actuator causes the gripper arms to move between a gripper jaw first position in which the gripper arms are spaced from the electrical component and a gripper jaw second position in which the gripper arms engage side surfaces of the electrical component to prevent the electrical component from moving in a direction transverse to a longitudinal axis of the gripper head. The gripper arms have projections which extend transverse to the longitudinal axis of the gripper head. The projections are provided in engagement with second surface of the electrical component. A securing plate extends from the base, the securing plate has a securing projection extending from a surface of the securing plate. The securing plate is connected to the second actuator wherein the actuation of the second actuator causes the securing plate to move between a securing plate first position in which the securing plate is spaced from the electrical component and a securing plate second position in which the securing plate engages the first surface of the electrical component and the securing projection engages a side wall of the opening to provide an interference fit between the securing projection and the side wall of the opening, the cooperation of the projections with the second surface and the securing plate and securing projection with the first surface prevent the electrical component from moving in a direction in line with the longitudinal axis of the gripper head and prevent the electrical component from moving rotationally about the longitudinal axis. The electrical component is held in a fixed position relative to the gripper head when the gripper arms are in the gripper jaw second position and the securing plate and the securing projection are in the securing plate second position.

An embodiment is directed to a method of securing an electrical component in a gripper head. The method includes: securing the electrical component between gripper jaws of the gripper head to prevent the movement of the electrical component relative to the gripper head in a direction transverse to a longitudinal axis of the gripper head; and securing the electrical component between a securing plate having a securing projection and portions of the gripper jaws to prevent movement of the electrical component relative to the gripper head in a direction in line with the longitudinal axis of the gripper head and prevent movement of the electrical component relative to the gripper head rotationally about the longitudinal axis. The electrical component is held in a fixed position relative to the gripper head when the electrical component is secured between the gripper jaws and the electrical component is secured between the securing plate with the securing projection and the portions of the gripper jaws.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIG. 8 is a perspective view of the electrical component positioned proximate the gripper head, with the gripper jaws and securing plate in their first or initial position.

FIG. 9 is a perspective view similar to that of FIG. 8, with the gripper jaws moved to the second position and securing plate maintained in first position.

FIG. 10 is a perspective view similar to that of FIG. 8, with the gripper jaws and securing plate moved to the second position to retain the electrical component in position relative to the gripper head.

DETAILED DESCRIPTION OF THE INVENTION

Figure 1:
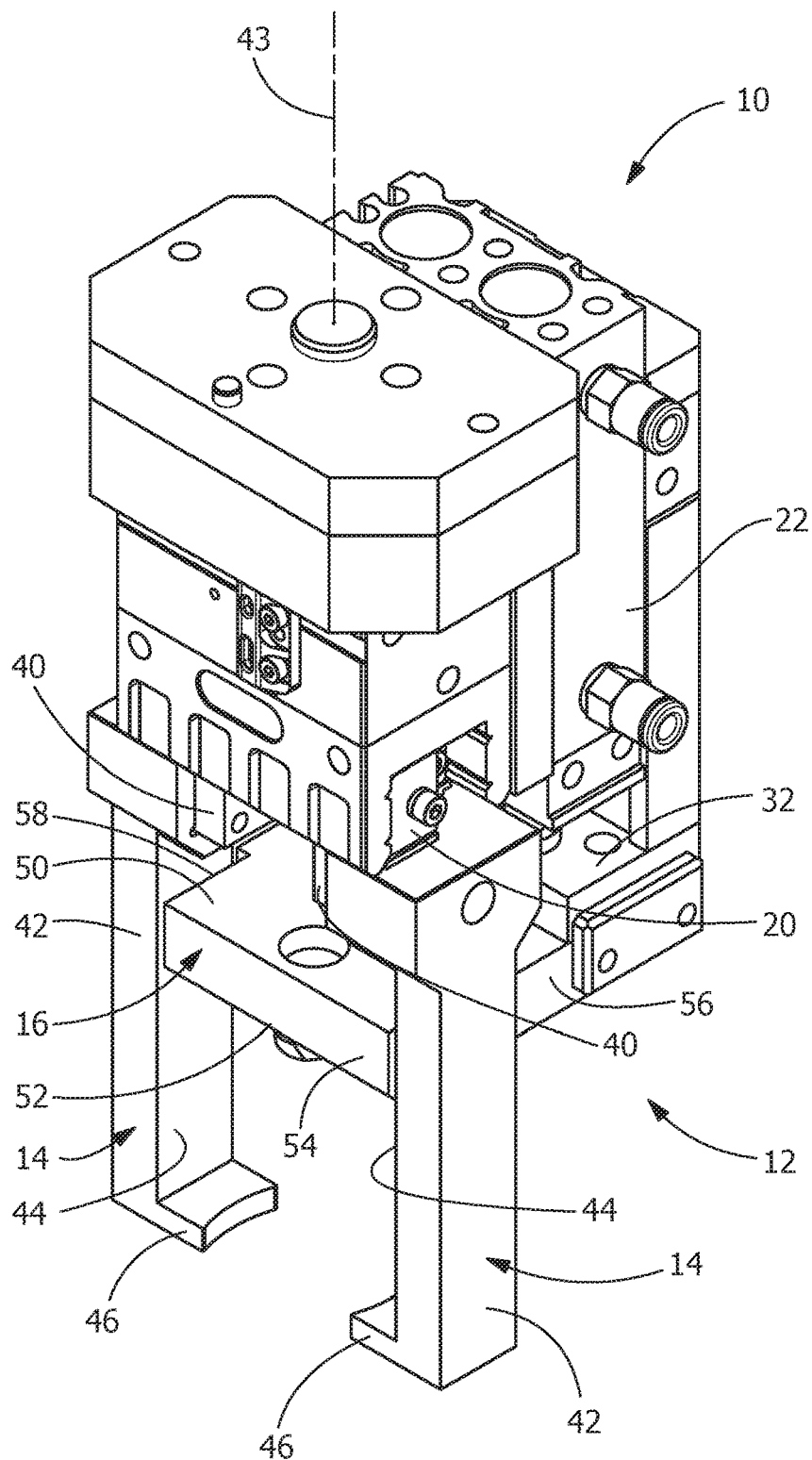
FIG. 1 is a perspective view of an illustrative embodiment of a gripper head according to the present invention.
Figure 2:
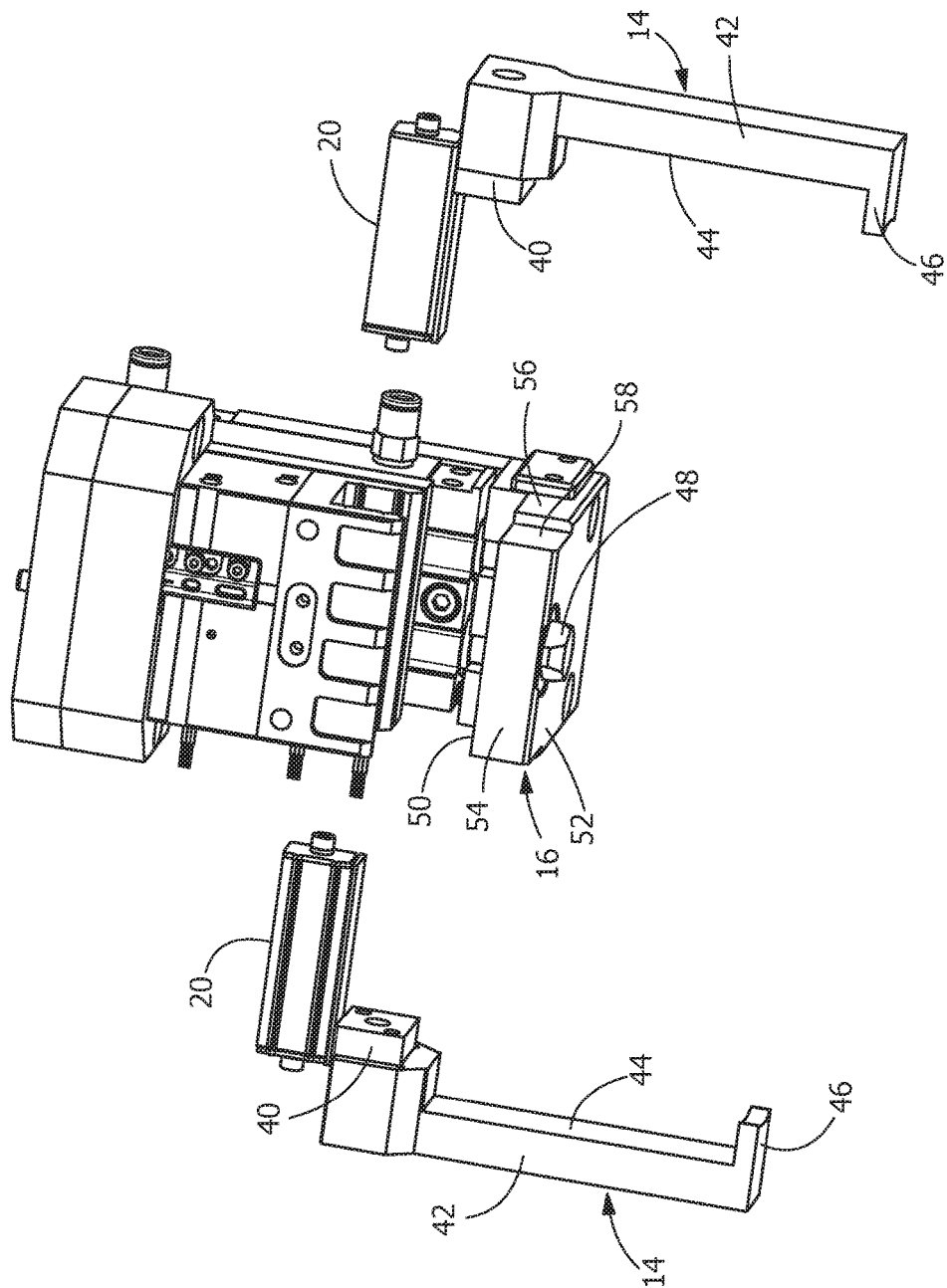
FIG. 2 is an exploded perspective view of the gripper head of FIG. 1, with gripper arms and first actuators exploded from the gripper head.
Figure 3:
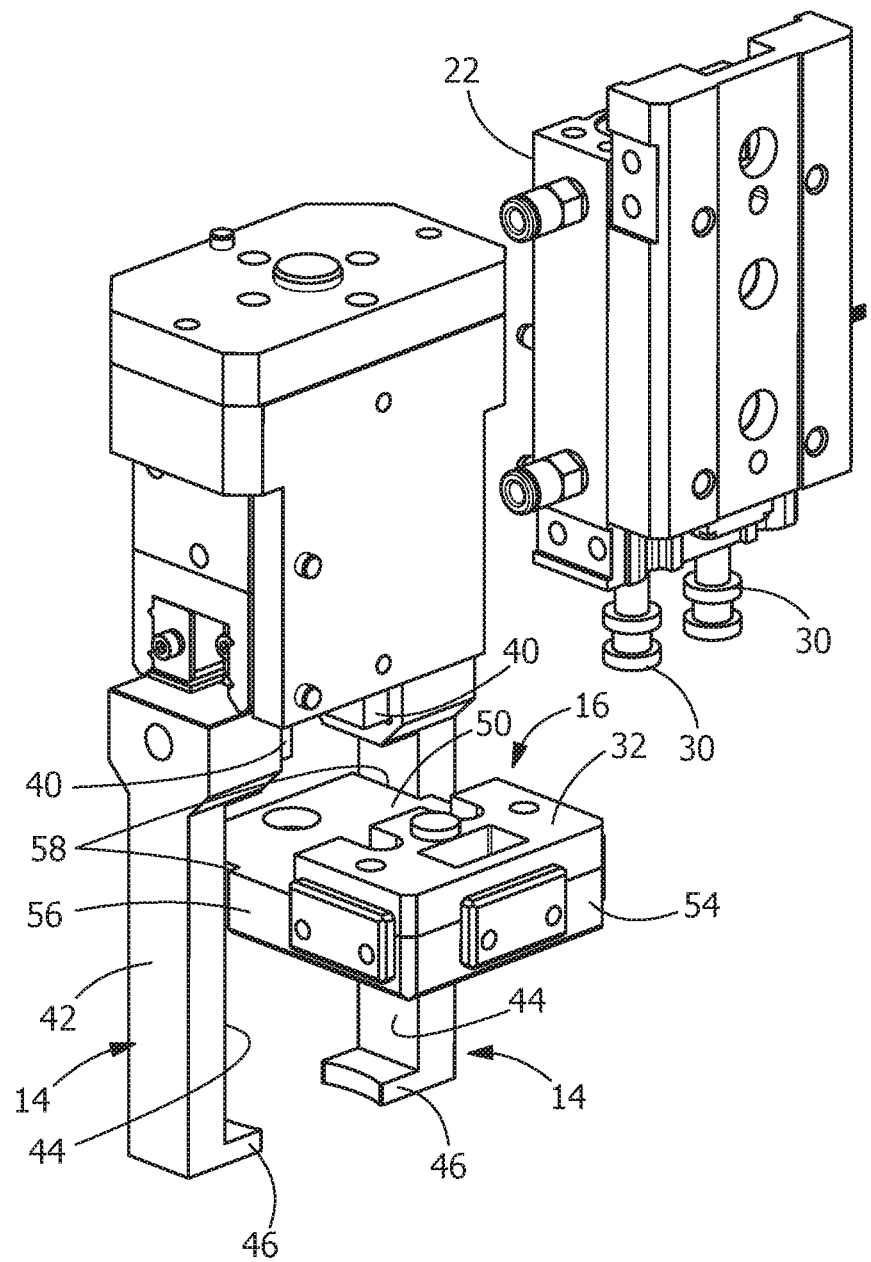
FIG. 3 is an exploded perspective view of the gripper head of FIG. 1, with a securing plate and a second actuator exploded from the gripper head.
Figure 4:
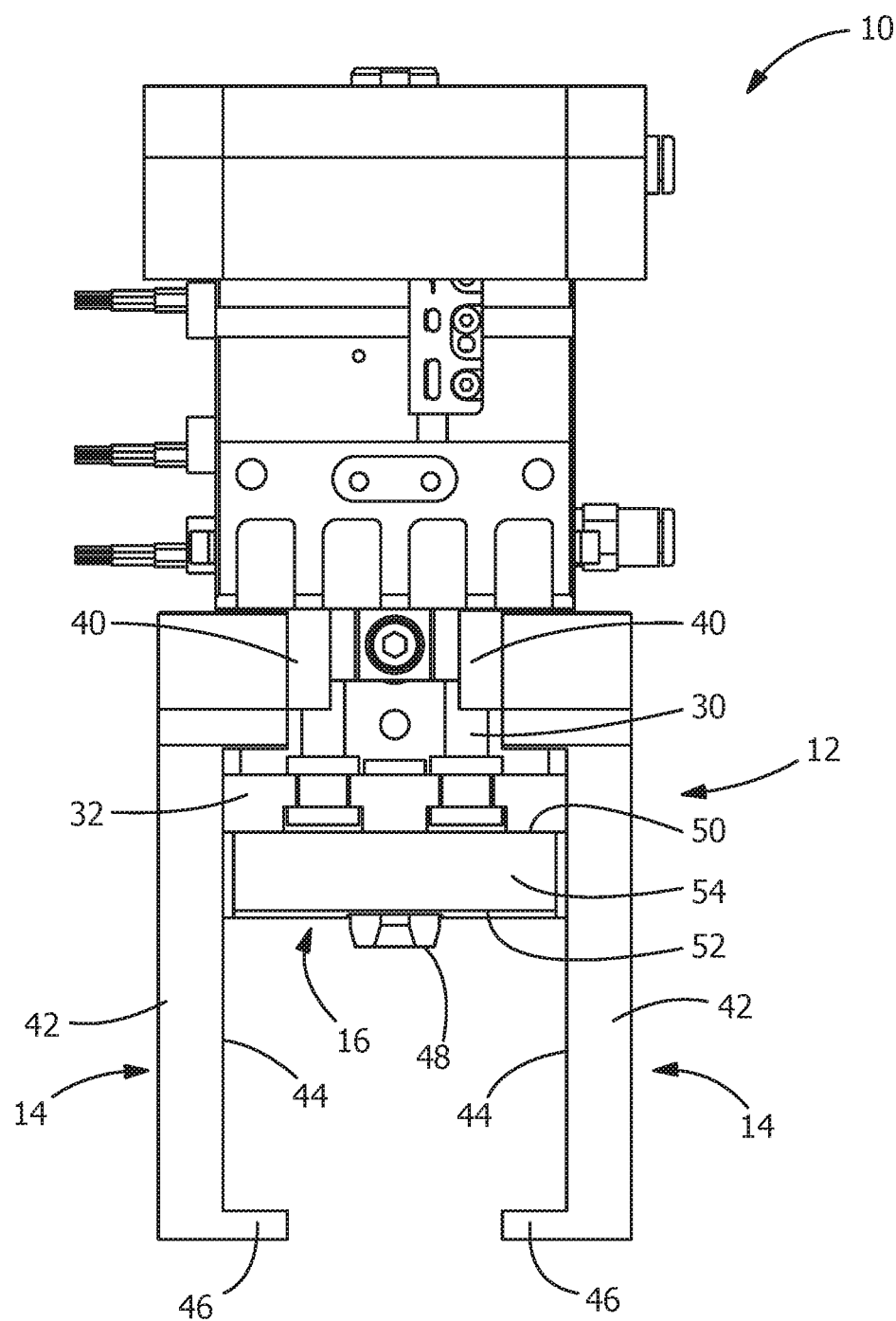
FIG. 4 is a front view of the gripper head of FIG. 1.
Figure 5:
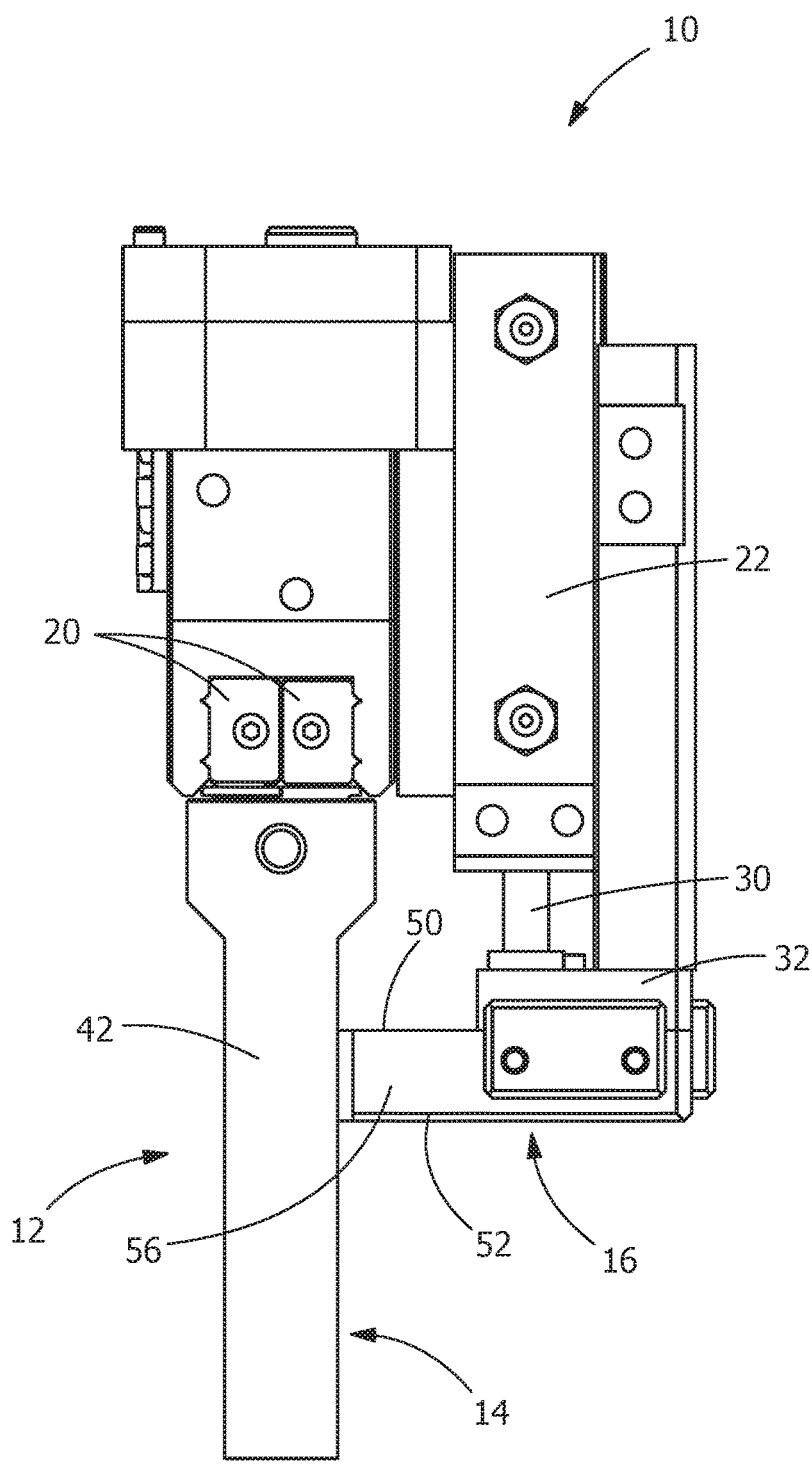
FIG. 5 is a side view of the gripper head of FIG. 1.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features, the scope of the invention being defined by the claims appended hereto.

As best shown in FIGS. 1 through 6, a gripper head 10, according to the present invention, has a base 12 with gripper jaws 14 and a securing plate 16 extending therefrom. The base 12 includes first actuators 20 and a second actuator 22. In the illustrative embodiment shown, the first actuators 20 are first air cylinders and the second actuator 22 is a second air cylinder. However, other type of actuators, such as, but not limited to, pneumatic cylinders, can be used.

As the first actuators 20 are actuated, the gripper jaws 14 are moved from a gripping jaw first position (FIG. 8) to a gripping jaw second position (FIG. 9) in which the gripper jaws 14 are positioned closer together than they are in the first position. As the operation of air cylinders and pneumatic cylinders are well known in the art, a further explanation of the first actuators 20 will not be provided.

The second actuator 22 has drive shafts 30 which extend therefrom. As the second actuator 22 is actuated, the drive shafts 30 are moved from a securing plate first position (FIG. 8) to a securing plate second position (FIG. 10) in which the drive shafts 30 are extended further from the second actuator 22 than they are in the first position. As the operation of air cylinders and pneumatic cylinders are well known in the art, a further explanation of the second actuator 22 will not be provided.

The gripper jaws 14 have attachment portions 40 which couple the first actuators 20 to the gripper arms 42. The gripper arms 42 extend in a direction which is essentially parallel to the longitudinal axis 43 of the gripper head 10. The gripper arms 42 have inside surfaces 44. In the illustrative embodiment shown, the gripper head 10 has two gripper jaws 14. The gripper jaws 14 are positioned such that the inside surfaces 44 of the respective gripper arms 42 face toward each other.

Gripper fingers or projections 46 are provided at free ends of the gripper arms 42. The gripper fingers or projections 46 extend from the inside surfaces 44 of each of the gripper arms 42 in a direction toward the opposed gripper arm 44. The gripper fingers or projections 46 extend from the gripper arms 42 in a direction which is generally transverse to the longitudinal axis of the gripper head 10 and to the longitudinal axis of the gripper arms 42.

The securing plate 16 has a first surface 50, an oppositely facing second surface 52, end surfaces 54, and side surfaces 56. In the illustrative embodiment shown, the drive shafts 30 are attached to an attachment plate 32 which is attached to the first surface 50 of the securing plate 16. However, the drive shafts 30 may be attached at other locations or by other devices to the securing plate 16. Recesses 58 provided within the side surfaces 56 receive the gripper arm 42. The width of the securing plate 16 between the recesses 58 is dimensioned to not interfere with the gripping arms 42 as the gripping arms 42 are moved from the securing plate first position to the gripping jaw second position.

Figure 6:
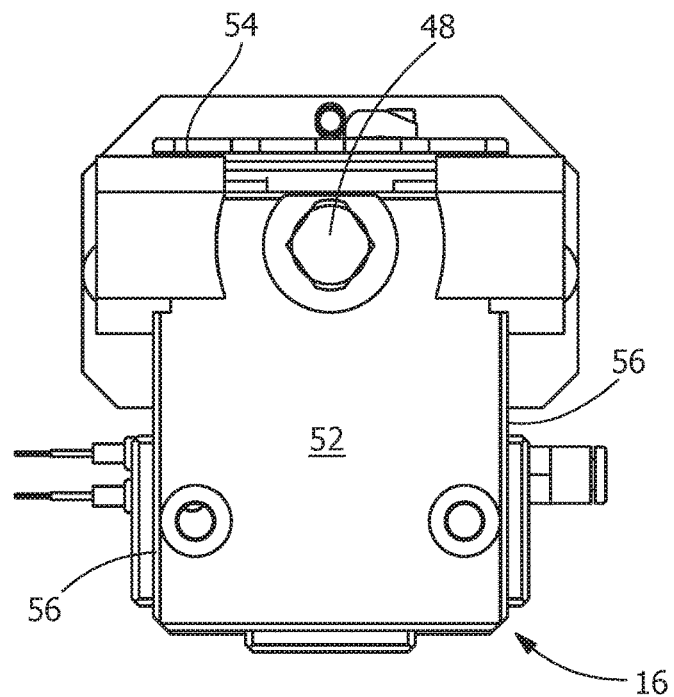
FIG. 6 is a bottom view of a securing plate of the gripper head.

A securing projection 48 extends from the second surface 52 in a direction away from the first surface 50. The securing projection 48, as best shown in FIG. 6, has a polygon shape, such as a diamond shape. However, the securing projection 48 may have other shapes, including, but not limited to, a conical shape or a pyramidal shape.

Figure 7:
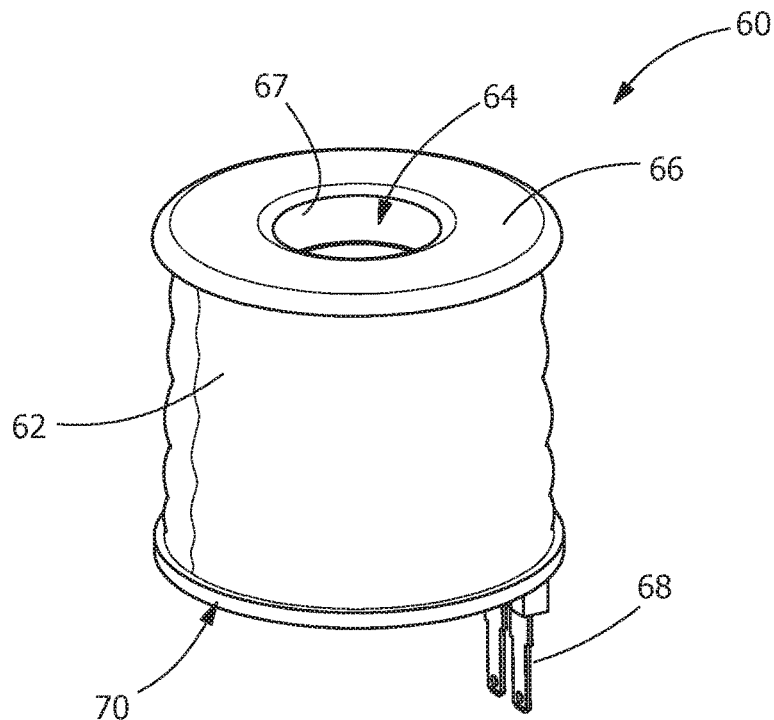
FIG. 7 is perspective view of an illustrative electrical component with which the gripper mechanism of FIG. 1 can be used.

Referring to FIG. 7, an illustrative electrical component 60 is shown. The electrical component 60 is a contact relay assembly with a cylindrical outer shell 62. An opening 64 is provided in a first surface 66 of the electrical component 60 and defines a sidewall 67 therein. Contacts 68 extend from a second surface 70 of the electrical component 60.

Referring to FIGS. 8, 9 and 10, the operation of the gripper head will be described. As shown in FIG. 8, the gripper head 10 and the electrical component 60 are positioned in alignment. This can occur by the movement of the gripper head 10 relative to the electrical component 60, by the movement of the electrical component 60 relative to the gripper head 10, or a combination thereof. In this position, the electrical component 60 is positioned in a pocket of a tray or the like (not shown) which allows for the gripper fingers or projections 46 to be inserted below the second surface 70 of the electrical component 60.

With the gripper head 10 properly positioned in the position shown in FIG. 8, the first actuator 20 is actuated, causing the gripping jaws 14 to move toward each other. This continues until the inside surfaces 44 of the gripper arms 42 are placed in engagement with the outer shell 62 of the electrical component 60, as shown in FIG. 9. In this position, the gripping fingers or projections 46 are positioned proximate the second surface 70 of the electrical component 60. With the gripper jaws 14 properly positioned in the gripper jaw second position, the inside surfaces 44 of the gripper arms 42 engage the electrical component 60 to prevent the electrical component 60 from moving in a direction transverse to the longitudinal axis 43 of the gripper head 10.

With the gripper jaws 14 positioned in the gripper jaw second position properly shown in FIG. 9, the second actuator 22 is actuated, causing the securing plate 16 to move toward the gripping fingers or projections 46. This continues until the second surface 52 of the securing plate 16 is placed in engagement with the first surface 66 of the electrical component 60 and the gripping fingers 46 are placed in engagement with the second surface 70 of the electrical component 60, as shown in FIG. 10. The second surface 52 of the securing plate 16 engages the first surface 66 of the electrical component 60 and the gripping fingers 46 engage the second surface 70 of the electrical component 60 to prevent the electrical component 60 from moving in a direction in line with the longitudinal axis of the gripper head 10.

In addition, in the position shown in FIG. 10, the securing projection 48 is inserted into the opening 64 in the first surface 66 of the electrical component 60. Due to the shape and positioning of the securing projection 48, the securing projection 48 engages the side wall 67 of the opening 64 to provide an interference fit between the securing projection 48 and the side wall 67 of the opening 64. The interference fit and the force supplied by the securing plate 16 on the electrical component 60 prevent the electrical component 60 from moving rotationally about the longitudinal axis of the gripper head 10. In an optional embodiment, the opening 64 is similarly shaped to the shape of the projection 48 to provide a locking engagement between the securing plate 16 and the electrical component 60.

With the electrical component 60 secured to the gripper head 10, as shown in FIG. 10, the electrical component is properly secured or locked in the gripper head 10 and positioned relative to the gripper head 10. Consequently, the contacts 68 of the electrical component 60 can be inserted into a mating component which has a tight clearance with minimal risk of bending the contacts during insertion.

The gripper head 10 can pick up electrical components 60 and lock the components 60 in position relative to the gripper head 10, preventing the electrical component 60 from moving in a direction transverse to a longitudinal axis of the gripper head 10, preventing the electrical component 60 from moving in a direction in line with the longitudinal axis 43 of the gripper head 10 and preventing the electrical component 60 from moving rotationally about the longitudinal axis 43 of the gripper head 10. The gripper head 10, including the gripper jaws 14 and the securing plate 16 is scalable to be used with different sized electrical components. In addition, each gripper head 10 may be used with differently sized and shaped electrical components within a defined range of sizes.

While the invention has been described with reference to a preferred embodiment, it will be understood by those skilled in the art that various changes may be made and equivalents may be substituted for elements thereof without departing from the spirit and scope of the invention as defined in the accompanying claims. In particular, it will be clear to those skilled in the art that the present invention may be embodied in other specific forms, structures, arrangements, proportions, sizes, and with other elements, materials and components, without departing from the spirit or essential characteristics thereof. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A gripper head for use to pick up and securely hold an electrical component, the gripper head comprising:
   a base having a first actuator and a second actuator;
   gripper jaws extending from the base, the gripper jaws connected to the first actuator wherein the actuation of the first actuator causes gripper arms of the gripper jaws to move between a gripper jaw first position in which the gripper arms are spaced from the electrical component and a gripper jaw second position in which the gripper arms engage the electrical component to prevent the electrical component from moving in a direction transverse to a longitudinal axis of the gripper head;
   a securing plate extending from the base, the securing plate having a securing projection extending from a surface of the securing plate, the securing plate connected to the second actuator wherein the actuation of the second actuator causes the securing plate to move between a securing plate first position in which the securing plate is spaced from the electrical component and a securing plate second position in which the securing plate and the securing projection engage the electrical component to prevent the electrical component from moving in a direction in line with the longitudinal axis of the gripper head and rotationally about the longitudinal axis;
   wherein the electrical component is held in a fixed position relative to the gripper head when the gripper arms are in the gripper jaw second position and preventing the electrical component from moving the securing plate and the securing projection are in the securing plate second position.

2. The gripper head as recited in claim 1, wherein the gripper arms extend from the base in a direction which is parallel to the longitudinal axis of the gripper head, the gripper arms have inside surfaces which face each other.

3. The gripper head as recited in claim 2, wherein the gripper jaws have projections which extend from the inside surfaces of the gripper arms in a direction which is transverse to the longitudinal axis of the gripper head, the projections provided in engagement with a surface of the electrical component when the securing plate is in the securing plate second position.

4. The gripper head as recited in claim 1, wherein the securing plate has side surfaces with gripping arm receiving recesses for receiving the gripping arms when the gripper arms are in the gripper jaw second position.

5. The gripper head as recited in claim 1, wherein the securing projection of the securing plate has a polygon shaped configuration.

6. The gripper head as recited in claim 1, wherein the gripper jaws have attachment portions which attach to drive arms which extend from the first actuator.

7. The gripper head as recited in claim 1, wherein the securing plate is attached to drive shafts which extend from the second actuator.

8. The gripper head as recited in claim 1, wherein the first actuator is a first air cylinder and the second actuator is a second air cylinder.

9. The gripper head as recited in claim 1, wherein the securing plate has side surfaces with gripping arm receiving recesses for receiving the gripping arms when the gripper arms are in the gripper jaw second position.

10. The gripper head as recited in claim 1, wherein the securing projection of the securing plate has a polygon shaped configuration.

11. The gripper head as recited in claim 1, wherein the gripper jaws have attachment portions which attach to drive arms which extend from the first actuator.

12. The gripper head as recited in claim 1, wherein the securing plate is attached to drive shafts which extend from the second actuator.

13. The gripper head as recited in claim 1, wherein the first actuator is a first air cylinder and the second actuator is a second air cylinder.

14. The gripper head as recited in claim 1, wherein the gripper arms extend from the base in a direction which is parallel to the longitudinal axis of the gripper head, the gripper arms have inside surfaces which face each other.

15. A gripper head for use to pick up and securely hold an electrical component, the electrical component have a first surface with an opening, and oppositely facing second surface and side surfaces which extend between the first surface and the second surface the gripper head comprising:
a base having a first actuator and a second actuator;
gripper jaws extending from the base, the gripper jaws having gripper arms which are spaced from the base, the gripper arms connected to the first actuator wherein the actuation of the first actuator causes the gripper arms to move between a gripper jaw first position in which the gripper arms are spaced from the electrical component and a gripper jaw second position in which the gripper arms engage side surfaces of the electrical component to prevent the electrical component from moving in a direction transverse to a longitudinal axis of the gripper head, the gripper arms having projections which extend transverse to the longitudinal axis of the gripper head, the projections provided in engagement with second surface of the electrical component;
a securing plate extending from the base, the securing plate having a securing projection extending from a surface of the securing plate, the securing plate connected to the second actuator wherein the actuation of the second actuator causes the securing plate to move between a securing plate first position in which the securing plate is spaced from the electrical component and a securing plate second position in which the securing plate engages the first surface of the electrical component and the securing projection engages a side wall of the opening to provide an interference fit between the securing projection and the side wall of the opening, the cooperation of the projections of the gripper arms with the second surface and the securing plate and securing projection with the first surface and the opening prevent the electrical component from moving in a direction in line with the longitudinal axis of the gripper head and preventing the electrical component from moving rotationally about the longitudinal axis;
wherein the electrical component is held in a fixed position relative to the gripper head when the gripper arms are in the gripper jaw second position and the securing plate and the securing projection are in the securing plate second position.

16. A method of securing an electrical component in a gripper head, the method comprising:
securing the electrical component between gripper jaws of the gripper head to prevent the movement of the electrical component relative to the gripper head in a direction transverse to a longitudinal axis of the gripper head, the gripper jaws being connected to a first actuator positioned in the base, the actuation of the first actuator causes the gripper jaws to move between a gripper jaw first position in which the gripper jaws are spaced from the electrical component and a gripper jaw second position in which the gripper jaws engage side surfaces of the electrical component;
securing the electrical component between a securing plate having a securing projection and portions of the gripper jaws to prevent movement of the electrical component relative to the gripper head in a direction in line with the longitudinal axis of the gripper head and prevent movement of the electrical component relative to the gripper head rotationally about the longitudinal axis, the securing plate being connected to a second actuator, the actuation of the second actuator causes the securing plate to move between a securing plate first position in which the securing plate is spaced from the electrical component and a securing plate second position in which the securing plate and the securing projection engage the first surface of the electrical component;
wherein the electrical component is held in a fixed position relative to the gripper head when the electrical component is secured between the gripper jaws and the electrical component is secured between the securing plate with the securing projection and the portions of the gripper jaws.

17. The method as recited in claim 16, wherein the gripper jaws extend from a base of the gripper head, the gripper jaws have gripper arms which are spaced from the base.

18. The method as recited in claim 17, wherein the gripper arms have projections which extend transverse to the longitudinal axis of the gripper head, the projections provided in engagement with the electrical component.

19. The method as recited in claim 17, wherein the securing plate extends from a base of the gripper head.

20. The method as recited in claim 19, wherein the securing projection of the securing plate has a polygon shaped configuration.

\* \* \* \* \*